United States Patent
Diao et al.

(10) Patent No.: US 12,360,867 B2
(45) Date of Patent: Jul. 15, 2025

(54) MEMORY FAULT RECOVERY METHOD AND SYSTEM, AND MEMORY

(71) Applicant: Huawei Technologies Co., Ltd., Shenzhen (CN)

(72) Inventors: Yangbin Diao, Chengdu (CN); Lei Yuan, Chengdu (CN); Hua Chen, Dongguan (CN); Yonggui Liang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/437,707

(22) Filed: Feb. 9, 2024

(65) Prior Publication Data

US 2024/0176714 A1 May 30, 2024

Related U.S. Application Data

(63) Continuation of application No. PCT/CN2022/092017, filed on May 10, 2022.

(30) Foreign Application Priority Data

Aug. 17, 2021 (CN) .......................... 202110943369.6
Mar. 7, 2022 (CN) .......................... 202210214956.6

(51) Int. Cl.
*G06F 11/20* (2006.01)
(52) U.S. Cl.
CPC ................................ *G06F 11/2094* (2013.01)
(58) Field of Classification Search
CPC ............. G06F 11/2094; G06F 11/2033; G06F 11/2041; G06F 11/20; G06F 11/201

USPC ...................................... 714/6.32, 6.13, 6.3
See application file for complete search history.

(56) References Cited

U.S. PATENT DOCUMENTS

| | | | |
|---|---|---|---|
| 9,432,298 B1 * | 8/2016 | Smith | H04L 49/9057 |
| 2004/0230767 A1 | 11/2004 | Bland et al. | |
| 2009/0006886 A1 * | 1/2009 | O'Connor | G06F 11/108 |
| | | | 714/E11.034 |
| 2014/0068319 A1 * | 3/2014 | Daly | G11C 7/1006 |
| | | | 711/E12.008 |
| 2017/0139771 A1 * | 5/2017 | Chung | G06F 3/0679 |
| 2018/0074734 A1 * | 3/2018 | Dell | G06F 3/0653 |
| 2018/0165151 A1 * | 6/2018 | Lee | G06F 11/1048 |
| 2019/0172547 A1 * | 6/2019 | Yun | G11C 29/36 |
| 2023/0236934 A1 * | 7/2023 | Yang | G06F 11/1076 |
| | | | 714/6.24 |

FOREIGN PATENT DOCUMENTS

CN 103532728 B 5/2018

* cited by examiner

*Primary Examiner* — Chae M Ko
(74) *Attorney, Agent, or Firm* — Conley Rose, P.C.

(57) ABSTRACT

A system includes a processor and a memory. The processor locates a first memory chip that is faulty in a memory. After the first memory chip is isolated or replaced, the processor may reset the first memory chip when other memory chips in the memory are maintained to work normally. When a fault occurs in a memory chip in the memory, after the first memory chip that is faulty is isolated or replaced, the processor may independently reset the first memory chip without affecting the other memory chips in the memory. Resetting the first memory chip enables the first memory chip to restore to normal. A memory chip that can be normally used is used as a redundant memory chip or may continue to be used.

20 Claims, 4 Drawing Sheets

MEMORY FAULT RECOVERY METHOD AND SYSTEM, AND MEMORY

CROSS-REFERENCE TO RELATED APPLICATIONS

This is a continuation of International Patent Application No. PCT/CN2022/092017 filed on May 10, 2022, which claims priority to Chinese Patent Application No. 202210214956.6 filed on Mar. 7, 2022, which claims priority to Chinese Patent Application No. 202110943369.6 filed on Aug. 17, 2021. All of the aforementioned patent applications are hereby incorporated by reference in their entireties.

TECHNICAL FIELD

This disclosure relates to the field of storage technologies, and in particular, to a memory fault recovery method and system, and a memory.

BACKGROUND

As server technologies develop, a needed memory capacity is increasing. Memory failure has gradually become a common cause of server system hardware faults. After a memory fault occurs, a memory controller may replace a faulty BANK or memory chip, and stop writing data to the faulty BANK or chip.

After the faulty BANK or memory chip is replaced, if a correctable error (CE) still occurs in a memory, in other words, the faulty BANK or memory chip may still exist, and no redundant memory chip is available in the memory to continue to replace the faulty BANK or memory chip, the CE continues to occur, and finally become an uncorrectable error (UCE). As a result, an entire system breaks down, and it is necessary to replace hardware of a server or power on the server again.

SUMMARY

This disclosure provides a memory fault recovery method and system, and a memory, to reduce a probability of system breakdown caused by a memory fault.

According to a first aspect, an embodiment of this disclosure provides a memory fault recovery method. The memory fault recovery method can be used for recovering a faulty chip in a memory. In the method, a processor may first locate a first memory chip that is faulty in the memory. After determining the first memory chip, the processor may indicate a memory controller to isolate or replace the first memory chip. In this disclosure, after the first memory chip is isolated or replaced, the processor may reset the first memory chip when memory chips in the memory are maintained to work normally. The reset here means that the first memory chip is restored to an initial state. Herein, that the other memory chips work normally means that the other memory chips can maintain a current state. For example, data can be normally written into the other memory chips or data can be read from the other memory chips. In other words, the other memory chips are not affected by reset of the first memory chip.

According to the foregoing method, when a fault occurs in a memory chip in the memory, after the first memory chip that is faulty is isolated or replaced, the processor may independently reset the first memory chip without affecting the other memory chips in the memory. Resetting the first memory chip can enable the first memory chip to restore to normal. In this case, a memory chip that can be normally used always exists in the memory, and may be used as a redundant memory chip or may continue to be used. This can greatly reduce a probability of system breakdown caused by a memory fault without redundant memory chip replacement, and further effectively reduce hardware replacement or re-power-on.

In a possible implementation, when a CE in the memory exceeds a value threshold or performance of the first memory chip in the memory decreases, the processor may locate the first memory chip that is faulty in the memory.

According to the foregoing method, there are a plurality of cases in which the memory controller is triggered to locate the first memory chip, and the method is applicable to different scenarios.

In a possible implementation, the processor may be connected to a reset pin of the first memory chip by using a chip reset circuit. When resetting the first memory chip, the processor may send a reset instruction to the chip reset circuit. The reset instruction instructs to reset the first memory chip. After receiving the reset instruction, the chip reset circuit may perform an operation on the reset pin of the first memory chip based on the reset instruction, to reset the first memory chip.

According to the foregoing method, because the chip reset circuit is connected to the reset pin of the first memory chip, the processor can reset the first memory chip conveniently.

In a possible implementation, a structure or a specific type of the chip reset circuit is not limited in this disclosure. For example, the chip reset circuit may be a serial-to-parallel conversion circuit disposed in the memory, or may be a component deployed on a board (or a main board of a computing device) at which a processor is located, for example, a serial-to-parallel conversion circuit, a field-programmable gate array (FPGA), or a complex programmable logic device (CPLD). The chip reset circuit may be connected to a reset pin of each memory chip (including the first memory chip) in the memory.

According to the foregoing method, the structure or the specific type of the chip reset circuit is flexible and diversified, and an application scope of the memory fault recovery method is expanded.

In a possible implementation, when the processor includes some unused pins, the processor may also be directly connected to a reset pin of each memory chip in the memory. In other words, the processor may serve as the chip reset circuit. In this case, the processor may directly control each memory chip in the memory. For example, the processor may independently reset one or more memory chips.

According to the foregoing method, the pins of the processor can be fully used, and a manner in which the processor directly controls the memory chip enables the processor to be more efficient.

In a possible implementation, when replacing the first memory chip, the memory controller replaces the first memory chip with a second memory chip in the memory.

According to the foregoing method, the replacement manner can keep storage space of the memory unchanged, to ensure that there is still enough storage space in a case that there is a faulty memory chip in the memory.

In a possible implementation, after the first memory chip is replaced, data that needs to be written into the first memory chip is written into the second memory chip. After resetting the first memory chip, the processor may further indicate the memory controller to migrate the data of the second memory chip back to the first memory chip, and replace the second memory chip with the first memory chip.

According to the foregoing method, after the first memory chip is reset, the data is migrated back, and then the first memory chip is replaced, the first memory chip may still be used as a memory chip that is normally used in the memory, and the second memory chip may become a redundant memory chip again, so that the memory chip is restored to a state before a fault occurs in the first memory chip.

In a possible implementation, if the memory controller isolates the first memory chip, after resetting the first memory chip, the processor may further indicate the memory controller to de-isolate the first memory chip, in other words, continue to write data into the first memory chip.

According to the foregoing method, after resetting the first memory chip, the processor may de-isolate the first memory chip. In this way, the first memory chip can be normally used, and it can be ensured that the storage space of the memory is restored to a size before the first memory chip is isolated.

In a possible implementation, after the processor resets the first memory chip, if a fault still occurs in the memory or a memory chip with degraded performance exists, the memory controller may locate a third memory chip that is faulty in the memory, the first memory chip is used as a new redundant memory chip, and the third memory chip is replaced with the first memory chip.

According to the foregoing method, a redundant memory chip always exists in the memory, to ensure that a faulty memory chip can be replaced in time, thereby reducing a possibility of system breakdown.

In a possible implementation, after resetting the first memory chip, the processor may determine whether the first memory chip is normal. For example, after resetting the first memory chip, (before performing data back-migration), the processor may determine that the first memory chip is normal. Alternatively, after performing the data back-migration on the first memory chip, the processor may determine whether the first memory chip is normal. Alternatively, before and after the data back-migration, the processor may determine whether the first memory chip is normal. When determining the first memory chip, the processor may perform data writing and reading on the first memory chip by using the memory controller, to determine that the first memory chip is normal.

According to the foregoing method, after resetting the first memory chip, the processor determines whether the first memory chip is normal, so that it can be ensured that the first memory chip can run normally when the first memory chip is de-isolated or is replaced again.

According to a second aspect, an embodiment of this disclosure provides a memory fault recovery system. For beneficial effects, refer to related descriptions of the first aspect. Details are not described herein again. The system includes a memory and a processor. The processor may locate a first memory chip that is faulty in the memory. After the first memory chip is isolated or replaced, the processor may reset the first memory chip when other memory chips in the memory are maintained to work normally.

In a possible implementation, the system further includes a chip reset circuit. The processor is connected to a reset pin of the first memory chip by using the chip reset circuit. When resetting the first memory chip, the processor may send a reset instruction to the chip reset circuit. The reset instruction instructs to reset the first memory chip. After receiving the reset instruction, the chip reset circuit may perform an operation on the reset pin of the first memory chip based on the reset instruction, for example, perform power-on and power-off operations, to reset the first memory chip.

In a possible implementation, a structure or a specific type of the chip reset circuit is not limited in this disclosure. For example, the chip reset circuit may be a serial-to-parallel conversion circuit disposed in the memory, or may be a component deployed on a board (which may also be understood as a main board of a computing device) at which a processor is located, for example, a serial-to-parallel conversion circuit, an FPGA, or a CPLD. The chip reset circuit may be connected to a reset pin of each memory chip (including the first memory chip) in the memory.

In a possible implementation, when the processor includes some unused pins, the processor may also be directly connected to a reset pin of each memory chip in the memory. In other words, the processor may serve as the chip reset circuit. In this case, the processor may directly control each memory chip in the memory. For example, the processor may independently perform an operation on the reset pin of the first memory chip, to reset the first memory chip.

In a possible implementation, the system further includes a memory controller. The memory controller may replace or isolate the first memory chip. For example, the memory controller may replace or isolate the first memory chip based on an indication of the processor.

In a possible implementation, when replacing the first memory chip, the memory controller may replace the first memory chip with a second memory chip in the memory.

In a possible implementation, after resetting the first memory chip, the processor may indicate the memory controller to migrate data of the second memory chip back to the first memory chip, and replace the second memory chip with the first memory chip. In this way, the second memory chip may become a redundant memory chip again.

In a possible implementation, the memory controller isolates the first memory chip. After resetting the first memory chip, the processor may de-isolate the first memory chip. In this way, the first memory chip may be normally used.

In a possible implementation, after the processor resets the first memory chip, if a fault occurs again in the memory or a memory chip with degraded performance exists, for example, a third memory chip, the processor may locate the third memory chip that is faulty in the memory, and indicate the memory controller to replace the third memory chip with the first memory chip in the memory.

In a possible implementation, after resetting the first memory chip, the processor may perform data writing and reading on the first memory chip by using the memory controller, to determine that the first memory chip is normal.

According to a third aspect, an embodiment of this disclosure further provides a memory. The memory includes a chip reset circuit and a plurality of memory chips, and the chip reset circuit is separately connected to the plurality of memory chips. The chip reset circuit may receive a reset instruction from the processor. The reset instruction instructs to reset a first memory chip in the plurality of memory chips. After receiving the reset instruction, the chip reset circuit resets the first memory chip based on the reset instruction in a case that memory chips in the plurality of memory chips other than the first memory chip work normally. In the memory, the chip reset circuit can reset a single or several memory chips. In this way, a possibility of powering on the entire memory again when a memory fault occurs can be reduced.

In a possible implementation, the chip reset circuit may be separately connected to reset pins of the plurality of memory chips. When resetting the first memory chip, the chip reset circuit may perform an operation on a reset pin of the first memory chip, to reset the first memory chip. For beneficial effects, refer to descriptions of the first aspect. Details are not described herein again. The chip reset circuit may be a serial-to-parallel conversion circuit.

According to a fourth aspect, an embodiment of this disclosure further provides a fault recovery apparatus. The fault recovery apparatus may be deployed on a processor. For beneficial effects, refer to related descriptions of the first aspect. Details are not described herein again. The fault recovery apparatus includes a receiving module and a reset module.

The locating module is configured to locate a first memory chip that is faulty in a memory.

The reset module is configured to, after the first memory chip is isolated or replaced, reset the first memory chip when other memory chips in the memory are maintained to work normally.

In a possible implementation, the reset module may send a reset instruction to the chip reset circuit. The reset instruction instructs to reset the first memory chip.

In a possible implementation, the apparatus further includes a back-migration module. After the first memory chip is reset, the back-migration module may indicate a memory controller to migrate data of a second memory chip back to the first memory chip, and replace the second memory chip with the first memory chip.

In a possible implementation, after the first memory chip is reset, the reset module may further indicate the memory controller to de-isolate the first memory chip.

In a possible implementation, after resetting the first memory chip, the reset module may further perform data writing and reading on the first memory chip by using the memory controller, to determine that the first memory chip is normal.

Functions of the foregoing modules may be implemented by hardware, or may be implemented by hardware executing corresponding software. The hardware or software includes one or more modules corresponding to the foregoing functions.

According to a fifth aspect, an embodiment of this disclosure further provides a computing device. The computing device includes the memory fault recovery system mentioned in the first aspect.

According to a sixth aspect, this disclosure further provides a computer-readable storage medium. The computer-readable storage medium stores instructions. When the instructions are run on a computer, the computer is enabled to perform the method according to the first aspect and the possible implementations of the first aspect.

According to a seventh aspect, this disclosure further provides a computer program product including instructions. When the computer program product runs on a computer, the computer is enabled to perform the method according to the first aspect and the possible implementations of the first aspect.

According to an eighth aspect, this disclosure further provides a computer chip. The chip is connected to a memory. The chip is configured to read and execute a software program stored in the memory, to perform the method according to the first aspect and the possible implementations of the first aspect.

DESCRIPTION OF EMBODIMENTS

Figure 1:
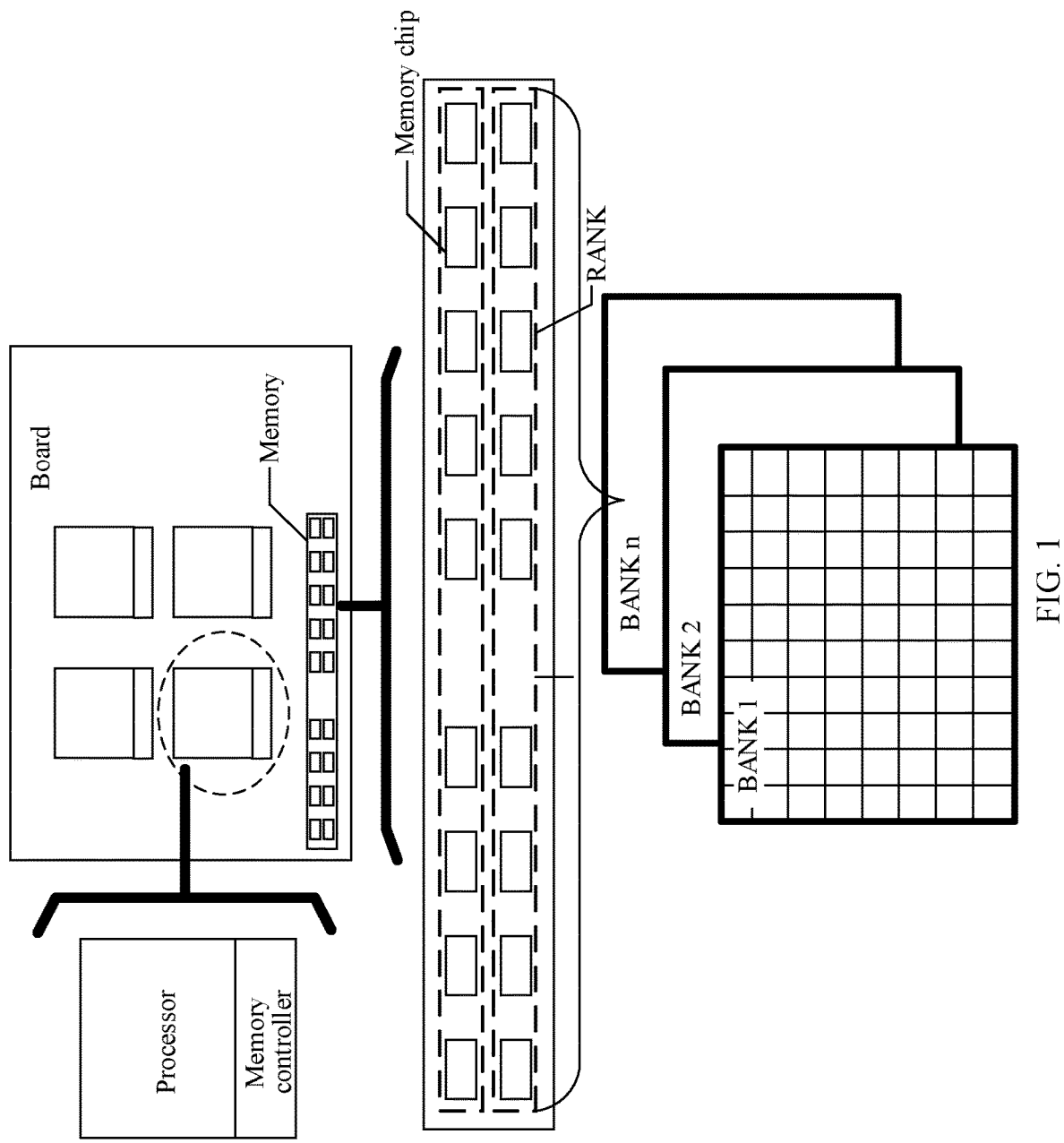
FIG. 1 is a schematic diagram of a structure of a board in a computing device according to an embodiment of this disclosure.

FIG. 1 is a schematic diagram of a structure of a board in a computing device. A processor and a memory controller are deployed on the board in the computing device. The memory controller and the processor may be deployed in a centralized manner. For example, it may be considered that the memory controller is a part of the processor. Optionally, a memory may be further deployed on the board. In FIG. 1, an example in which the memory is directly deployed on the board is used for description. In actual application, the memory may alternatively be inserted into the computing device through a memory slot, and is connected to the memory controller and the processor through a bus.

When performing an operation, the processor may read, from the memory through the memory controller, data that needs to be operated. The data that needs to be operated may be obtained from an external memory (for example, a storage medium such as a hard disk or a magnetic disk) of the computing device. The processor may further write, by using the memory controller, the data obtained after the operation into the memory. The memory may temporarily store data that needs to be operated by the processor or data obtained from an external memory (such as a hard disk) of a computer.

A type of the processor is not limited in embodiments of this disclosure. The processor may be a central processing unit (CPU), or may be another general-purpose processor, a digital signal processor (DSP), an application-specific integrated circuit (ASIC), an FPGA, or another programmable logic device, a discrete gate or transistor logic device, a discrete hardware component, an artificial intelligence chip, a chip on chip, or the like. The general-purpose processor may be a microprocessor, any conventional processor, or the like.

In the board shown in FIG. 1, because the memory has been deployed on the board, a size of the memory is usually fixed. For the memory inserted in a form of a slot, a quantity of memories that can be supported by the computing device is also limited.

In terms of a hardware structure, a smallest physical unit in the memory may be referred to as a memory chip. A specific quantity of memory chips may form a RANK. For example, a RANK may include eight memory chips. For another example, a RANK may include eight memory chips and one redundant memory chip. A memory may include a plurality of RANKs. For example, a memory may include two RANKs.

For memory chips in a RANK, the memory chips can form storage space of data. The storage space is logically divided. The storage space may include a plurality of BANKs. Each BANK may be considered as a storage matrix, and the storage matrix is like a grid matrix. This "grid matrix" has many columns and many rows. When particular data in the storage space needs to be obtained, only the rows and columns in the "grid matrix" need to be specified. This is also a basic principle of memory addressing. In other words, a BANK is actually a logical concept. A size, a quantity of rows, and a quantity of columns of each BANK are fixed. In other words, a logical address range covered by each BANK is fixed. When the processor needs to read data at a particular logical address, the memory controller may determine, by parsing the logical address, a BANK to which the logical address points, and rows and columns in the BANK. Logically, data in the memory is stored in the bank. Physically, the data in the memory is actually stored in the memory chip. There is a mapping relationship between the memory chip and the BANK. The mapping relationship may be referred to as a memory mapping relationship. The memory mapping relationship records a mapping relationship between a physical address and a logical address of the memory chip. During the computing device is powered on, the memory controller maintains the memory mapping relationship. For example, the memory controller may update information recorded in the memory mapping relationship.

For a redundant memory chip in the RANK, the redundant memory chip does not participate in forming the storage space in a case that other memory chips in the RANK are normal. When a fault occurs in a memory chip in the RANK, the redundant memory chip may replace the faulty memory chip to form the storage space.

In a scenario in which a memory fault occurs, different processing can be performed based on different fault cases. For example, for the fault in the memory chip, a partial cache line sparing (PCLS) technology may be used for replacing the faulty memory chip. For a fault in a single BANK, BANK replacement may be performed, and a new BANK is formed by using a redundant memory chip to replace the faulty BANK. In other words, a mapping relationship between a physical address of the redundant memory chip and a logical address of the BANK is updated in the memory mapping relationship. For a scenario in which faults occur in the plurality of BANKs, a similar manner can be used to perform memory chip replacement, and a plurality of new BANKs are formed by using redundant memory chips to replace the faulty BANKs.

In a current memory fault recovery method, because redundant memory chips in the memory are limited, when a manner of replacing a faulty memory chip is used, after the memory chip is replaced, if a fault in the memory chip or BANK is found again in the memory, there is no redundant memory chip for replacing the memory chip or BANK. In this case, the fault in the memory cannot be recovered. This causes frequent occurrence of a CE and even evolves to a UCE. When a UCE occurs, a system may break down, the computing device needs to be powered on again, hardware needs to be replaced, or the computing device needs to be returned to a factory for recovery. This causes service interruption of the computing device.

It can be learned that efficiency of the memory fault recovery method is not high. This increases a possibility of computing device breakdown, and increases a probability of hardware updating or returning to the factory.

In this embodiment of this disclosure, to reduce a possibility of computing device breakdown and avoid frequent hardware replacement and returning to the factory, in this embodiment of this disclosure, when a fault occurs in a memory, a processor may locate a faulty memory chip. After the faulty memory chip is replaced or isolated by using a redundant memory chip, and it is ensured that other memory chips work normally, the processor independently resets the faulty memory chip, to enable the faulty memory chip to restore to normal. By using this manner, it can be ensured that data of the redundant memory chip is not reduced, a case that a system breaks down due to no redundant memory when a memory fault occurs is reduced, and a possibility of hardware replacement and returning to the factory is reduced.

The following describes a processor system used in embodiments of this disclosure. For details, refer to FIG. 2A, FIG. 2B, FIG. 2C, and FIG. 2D.

Figure 2A:
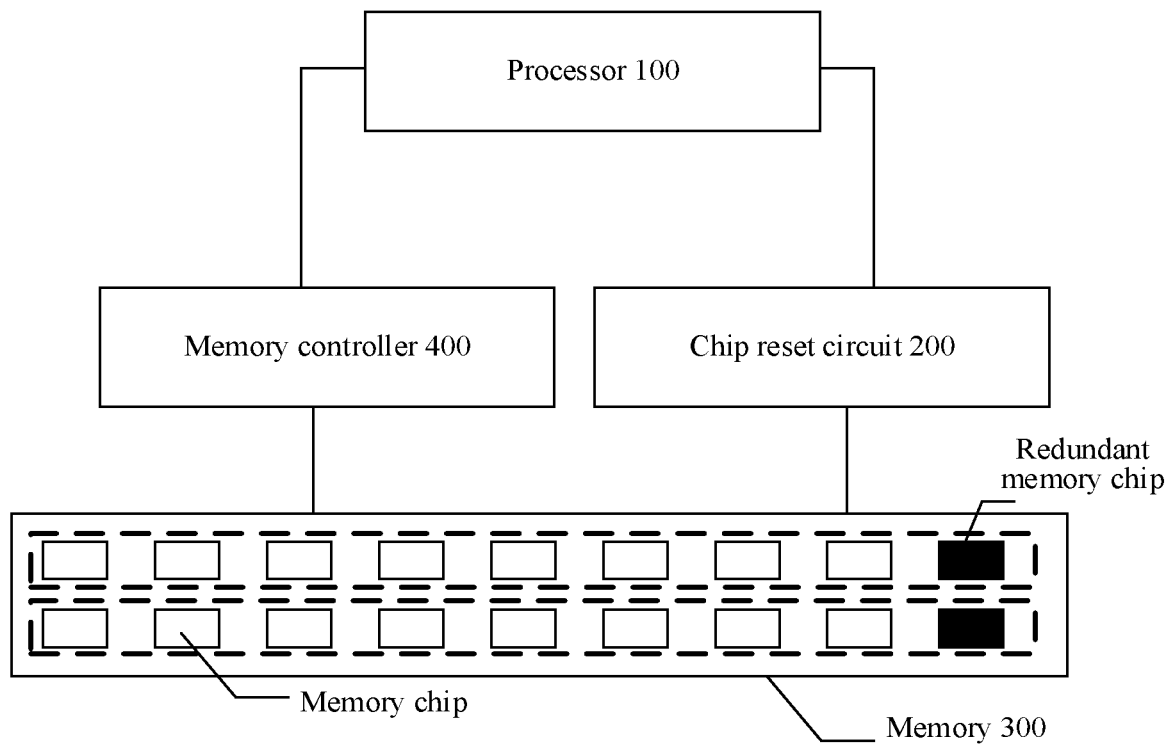
FIG. 2A, FIG. 2B, FIG. 2C, and FIG. 2D are schematic diagrams of structures of a memory fault recovery system according to this disclosure.

FIG. 2A shows a memory 300 fault recovery system according to an embodiment of this disclosure. The memory fault recovery system includes a processor 100, a chip reset circuit 200, and a memory 300. The memory 300 includes a plurality of memory chips. Optionally, the system may further include a memory controller 400.

The processor 100 may be connected to an input end of the chip reset circuit 200. The chip reset circuit 200 includes a plurality of output ends. An output end of the chip reset circuit 200 may be connected to a memory chip in the memory 300.

For any memory chip of the memory 300, the memory chip includes a plurality of pins, and functions of the pins are different. The plurality of pins includes a reset pin. The reset pin is configured to control a reset state of the memory chip. A definition of the reset pin complies with an existing standard, for example, a Joint Electron Device Engineering Council (JEDEC) standard. For example, when a high level is inputted to the reset pin, the memory chip may maintain a normal state. When a low level is inputted to the reset pin, the memory chip stops working. When the memory chip is reset, the low level and the high level may be inputted to the reset pin in sequence. The reset means that the memory chip is restored to an unused state. When the memory chip is reset, data and an internal clock in the memory chip may be deleted, and a state machine may be initialized. In the foregoing description, a manner of inputting the low level to the reset pin to control the reset of the memory chip is actually to reset the memory chip in power-on and power-off manners. The manner is only a manner of implementing the reset. A specific manner of implementing the reset is not limited in this disclosure. Any manner in which one or more memory chips can be independently reset is applicable to this embodiment of this disclosure. A manner in which the reset pin controls the reset of the memory chip is usually set before the memory 300 is delivered from a factory. Manners set by different manufacturers may be different. When the chip reset circuit 200 is connected to a memory chip in the memory 300, an output end of the chip reset circuit 200 may be connected to a reset pin of the memory chip.

For functions of the processor 100, the memory 300, and the memory controller 400, refer to related descriptions in FIG. 1. Details are not described herein again. In this embodiment of this disclosure, in addition to the foregoing functions, the processor 100 can independently reset one or more memory chips in the memory 300.

A manner in which the processor 100 resets the memory chip in the memory 300 is not limited in this embodiment of this disclosure. For example, the processor 100 may send a reset instruction to the chip reset circuit 200. The reset instruction may instruct to reset one or more of the plurality of memory chips. After receiving the reset instruction, the chip reset circuit 200 may determine, based on the reset indication, the one or more memory chips that need to be reset. The chip reset circuit 200 inputs a control signal (for example, a low level) to the output ends connected to the reset pins of the one or more memory chips, so that the one or more memory chips are reset.

For example, a number of the memory chips may be 0 to n. A number of a memory chip to be reset is indicated in the reset instruction. After receiving the reset instruction, the chip reset circuit 200 determines, based on the reset instruction, the memory chip that needs to be reset, sets a level of a reset pin to the memory chip to a low level, and then resets the level to a high level, to implement power-on and power-off operations on the memory chip, so as to complete the reset of the memory chip.

A structure of the chip reset circuit 200 is not limited in this embodiment of this disclosure. The chip reset circuit 200 may be a serial-to-parallel conversion circuit, for example, PCA9555, or may be a component such as an FPGA, a CPLD, or the processor 100. All components or circuits that can control a single memory chip (for example, reset a memory chip) are applicable to this embodiment of this disclosure.

The processor 100 and the memory 300 may be disposed in different manners. The processor 100 may be connected to the chip reset circuit 200 in a different manner. The following lists three possible connection manners.

Figure 2B:
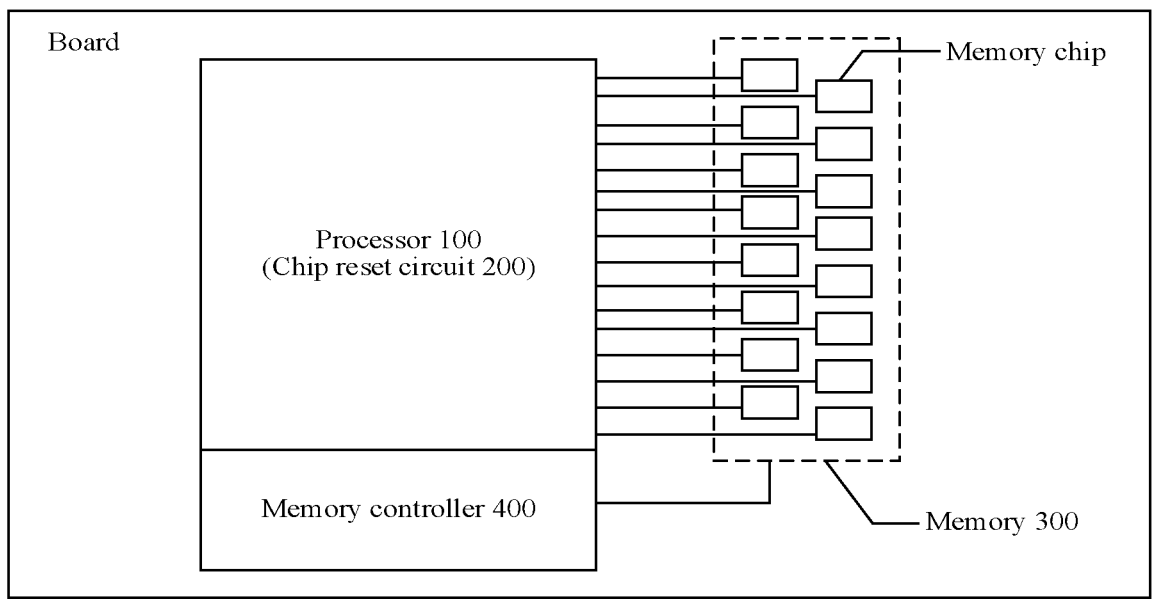
Figure 2C:
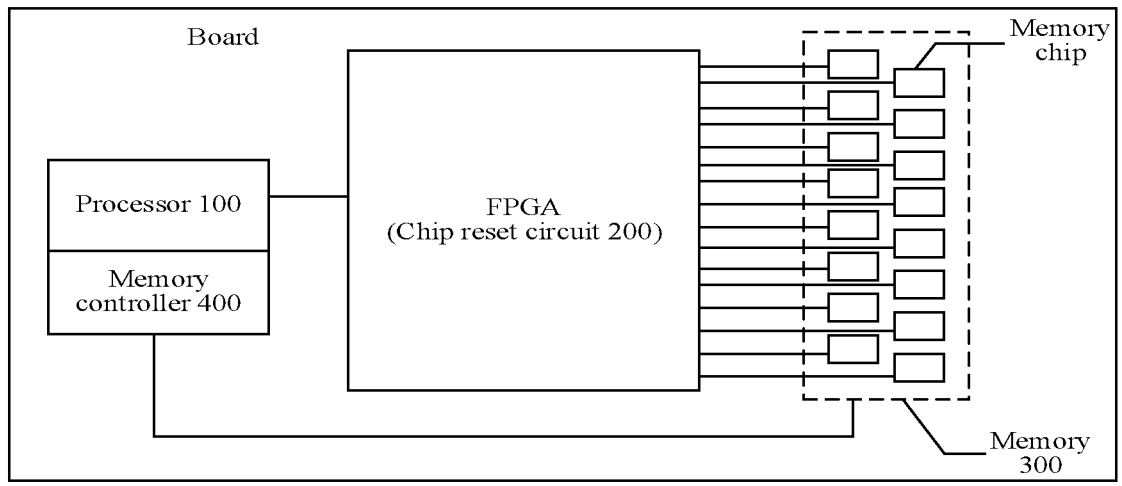

FIG. 2B and FIG. 2C show a memory fault recovery system according to an embodiment of this disclosure. In FIG. 2B and FIG. 2C, the processor 100 and the memory 300 may be deployed on a board in a centralized manner. The board may be a main board in a computing device such as a server or a personal computer. Another component, such as an FPGA or a CPLD, may also be deployed on the board.

There are some unused pins, that is, general-purpose input/output (GPIO), in a component of the processor 100, the FPGA, or the CPLD deployed on the board. In this case, the processor 100, the FPGA, or the CPLD may be used as the chip reset circuit 200. The unused pins of the processor 100, the FPGA, or the CPLD are used as the output ends, and are connected to the reset pins of the memory chips in the memory 300.

In FIG. 2B, there are some unused pins in the processor 100. In addition to having the foregoing functions, the processor 100 may further be used as the chip reset circuit 200. Some unused pins in the processor 100 may be used as the output ends of the chip reset circuit 200 and connected to the reset pins of the memory chips. In FIG. 2B, the processor 100 may directly reset the memory chips. For example, the processor 100 may directly adjust levels output by the pins, to reset the memory chips.

In FIG. 2C, an FPGA is used as an example. There are some unused pins in the FPGA. The FPGA may be used as the chip reset circuit 200. Some unused pins of the FPGA may be used as the output ends of the chip reset circuit 200 and connected to the reset pins of the memory chips. In FIG. 2B, the processor 100 may send a reset instruction to the FPGA. After receiving the reset instruction, the FPGA resets the memory chips based on the reset instruction. For example, the FPGA may adjust, based on the reset instruction sent by the processor 100, levels output by the pins, to reset the memory chips.

Figure 2D:
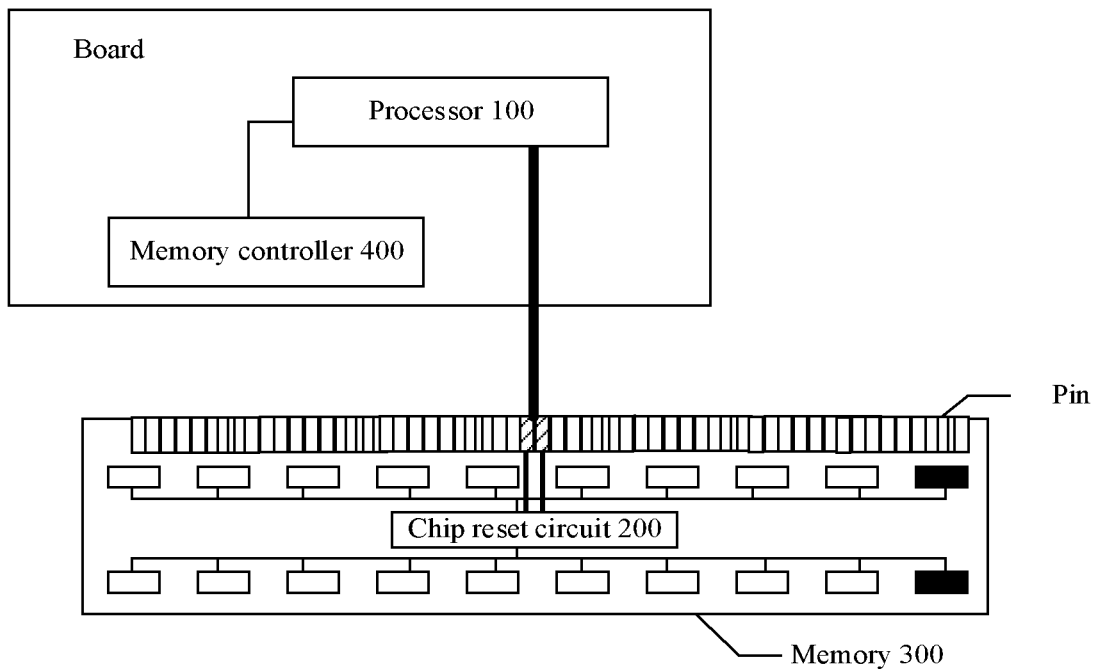

FIG. 2D shows a memory fault recovery system according to an embodiment of this disclosure. In FIG. 2D, the processor 100 is deployed on the board. The memory 300 may be connected to a computing device through a slot, and is connected to the processor 100 through a bus in the computing device.

The chip reset circuit 200 may be a serial-to-parallel conversion circuit, for example, a PCA9555 chip. The chip reset circuit 200 may be disposed in the memory 300. An input end of the chip reset circuit 200 may be connected to an I2C bus of the processor 100 through an Inter Integrated-Circuit (I2C) interface of the memory 300. In the memory 300, an output end of the chip reset circuit 200 is connected to the reset pin of each memory chip. Here, the I2C interface and the I2C bus are merely examples. The interface through which the chip reset circuit 200 is connected to the memory 300 and the bus through which the memory 300 is connected to the processor 100 are not limited in this embodiment of this disclosure. For example, a Serial Peripheral Interface (SPI) or an SPI bus may be used to connect the chip reset circuit 200 to the processor 100. In FIG. 2D, the processor 100 may send a reset instruction to the chip reset circuit 200. The reset instruction may be some serial binary data. After receiving the reset instruction, the chip reset circuit 200 resets the memory chips abased on the reset instruction. For example, the chip reset circuit 200 may convert the serial data into parallel data and output the parallel data from the output ends, to reset the memory chips.

Figure 3:
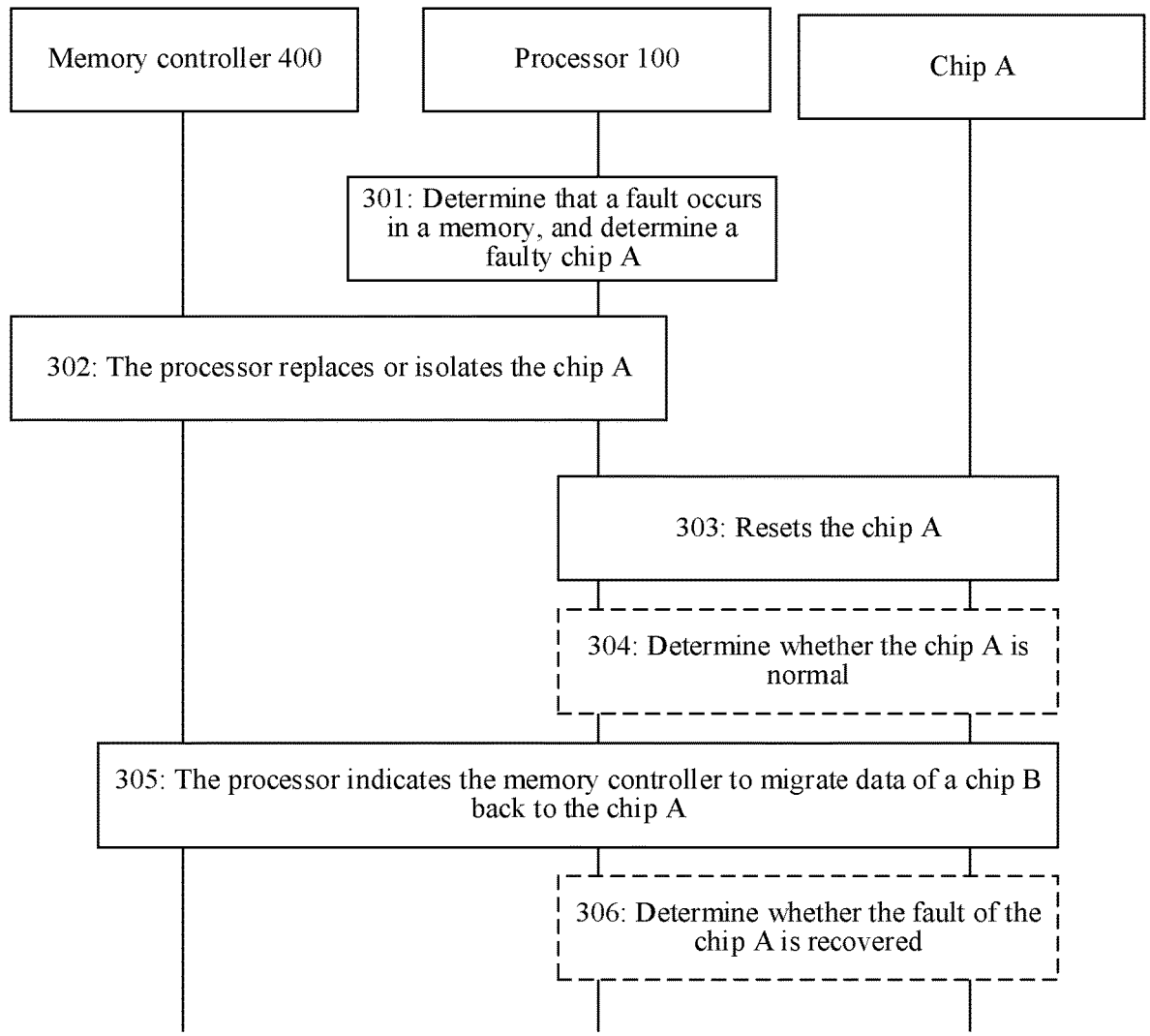
FIG. 3 is a schematic diagram of a memory fault recovery method according to this disclosure.

The following describes a memory fault recovery method according to embodiments of this disclosure with reference to the accompanying drawings. FIG. 3 is a memory fault recovery method according to an embodiment of this disclosure. The method is applicable to the memory fault recovery system shown in FIG. 2A to FIG. 2D. The method includes the following steps.

Step 301: A processor 100 determines that a fault occurs in a memory 300, and determines a faulty memory chip. For ease of description, the faulty memory chip is referred to as a chip A.

When the processor 100 needs to perform data reading and writing on the memory 300, the processor delivers an instruction to a memory controller 400. The memory controller 400 reads and writes data in the memory 300 based on the received instruction. For example, when the processor 100 needs to write data in the memory 300, the processor 100 delivers a write instruction to the memory controller 400. A logical address of to-be-written data and the to-be-written data are carried in the read instruction. After receiving the write instruction, the memory controller 400 computes a check digit of the data based on the to-be-written data, and writes the to-be-written data and the check digit of the data into a location indicated by the logical address. The check digit of the data is mainly used for check and error correction.

For example, when the processor 100 needs to read data from the memory 300, the processor 100 delivers a read instruction to the memory controller 400. A logical address of to-be-read data is carried in the read instruction. After receiving the read instruction, the memory controller 400 reads the data from the memory 300 based on the logical address of the to-be-read data. When reading the data, the memory controller 400 further reads a check digit of the data, and checks the data by using the check digit of the data. If the checking succeeds, it indicates that the read data is correct, and the memory controller 400 may feed the data back to the processor 100. If the check fails, it indicates that there is an error in the read data. The memory controller 400 may perform error correction on the data by using the check digit. If the error correction succeeds, it indicates that a CE occurs in the logical address. The memory controller 400 feeds the corrected data back to the processor 100. The memory controller 400 reports the logical address to the processor 100, to notify the processor 100 that the CE occurs in the logical address. After obtaining the logical address, the processor 100 may record the logical address in a system log, and indicate, in the system log, that the CE occurs on the logical address. If the error correction fails, the memory controller 400 may determine that an uncorrectable error occurs in the logical address. The memory controller 400 may directly notify the processor 100 that a UCE occurs in the logical address. Alternatively, the memory controller may perform data rewriting and rereading on the logical address to determine whether the uncorrectable error still occurs. When determining that the uncorrectable error still occurs, the memory controller notifies the processor 100 that the uncorrectable error occurs in the logical address. When determining to send the UCE, the processor 100 may reset the entire system. If the uncorrectable error no longer occurs, the memory controller 400 may also report the logical address to the processor 100, to notify that a UCE has occurred in the logical address and has been recovered. The processor 100 may record information (in which a UCE has occurred in the logical address and has been recovered) in the system log.

When a quantity of correctable errors that occur in the memory 300 exceeds a quantity threshold, the processor 100 may locate the faulty chip A.

The processor 100 may invoke a memory mapping table, and determine, based on a mapping relationship between a logical address and a physical address of each BANK recorded in the memory mapping table, a BANK or a memory chip to which a logical address occurring a correctable error points.

When each logical address in which the correctable error occurs points to a same BANK, the BANK is a faulty BANK, and a memory chip in which the BANK is located is the faulty chip A. When each logical address in which the correctable error occurs points to a same memory chip, for example, the logical addresses in which the correctable error occurs point to different BANKs, and these different BANKs are located in a same memory chip, the memory chip is the faulty chip A. It should be noted that the logical address may point to one or more BANKs. There may be one or more chips A being located.

Step 302: After locating the faulty memory chip, the processor 100 may replace or isolate the chip A. For example, the processor may indicate the memory controller 400 to replace or isolate the chip A.

Isolating the chip A means that data reading and writing on the chip A is stopped. The memory controller 400 may update the memory 300 mapping table, delete a mapping relationship related to a physical address of the chip A in the memory 300 mapping table, or mark the mapping relationship related to the physical address of the chip A as unavailable.

Replacing the chip A means that the faulty internal chip is replaced with a redundant memory chip in the memory controller 400. For ease of description, the redundant memory chip is referred to as a chip B. During replacement, the memory controller 400 may buffer data that needs to be written into the chip A, and then isolate the chip A. The memory controller 400 may update the memory 300 mapping table. The memory mapping table records a correspondence between the physical address and a logical address, so that a physical address in the memory mapping table that points to the chip A is changed to a physical address that points to the chip B. Then, the buffered data that needs to be written into the chip A is written into the chip B. It should be noted that a prerequisite for replacing the chip A is that there is a redundant memory chip in the memory, in other words, there is the chip B, and a quantity of the chip A is less than or equal to a quantity of the chip B. If the quantity of the chip A is greater than the quantity of the chip B, the processor 100 may not perform step 302 and subsequent steps, or replace only some chips A, and isolate other chips A.

For example, when it is determined, in step 301, that each logical address in which the correctable error occurs points to a same BANK, when the chip A is replaced, the memory controller 400 may construct a new BANK by using the chip B, and replace the faulty BANK with the new BANK. The memory controller 400 may update the memory 300 mapping table. For example, the memory controller 400 may update the physical address of the chip A in the memory 300 mapping table that has a mapping relationship with a logical address of the faulty BANK to the physical address of the chip B. To ensure that the chip A can be reset subsequently without affecting normal use of other BANKs different from the faulty BANK on the chip A, the memory controller 400 may migrate data in the other BANKs to the chip B, update the memory 300 mapping table, and update the physical address of the chip A in the memory mapping table that has a mapping relationship with the other BANKs to the physical address of the chip B.

When it is determined, in step 301, that each logical address in which the correctable error occurs points to a same memory chip, when the chip A is replaced, the memory controller 400 may replace the chip A with the chip B. The memory controller 400 may update the memory 300 mapping table. For example, the memory controller 400 may update the physical address of the chip A in the memory 300 mapping table to the physical address of the chip B.

In the foregoing descriptions, step 301 to 302 are performed when a fault occurs in the memory 300. This is merely an example for description. In actual application, replacement or isolation of a memory chip may also occur in another case. For example, when performance of a memory chip in the memory 300 is degraded, the memory 300 with degraded performance may also be isolated or replaced.

Step 303: The processor 100 resets the chip A.

For example, the processor 100 may deliver a reset indication to a chip reset circuit 200. Information about the chip A is carried in the reset indication. After receiving the reset indication, the chip reset circuit 200 may reset the chip A. For example, the chip reset circuit 200 inputs a low level to a reset pin of the chip A through an output end, and then inputs a high level, to complete the reset of the chip A.

Step 304: After completing the reset of the chip A, the processor 100 determines whether the chip A is normal. This step is an optional step. To be specific, the processor 100 may consider by default that after the chip A is reset, the chip A is normal, and step 305 does not need to be performed.

The processor 100 may perform data writing and reading on the chip A by using the memory controller 400, and determine whether there is an error in the data writing and reading, for example, determine whether there is an uncorrectable error or whether a quantity of correctable errors occurred exceeds a threshold. When it is determined that no uncorrectable error occurs in the chip A, or that the quantity of correctable errors occurred is less than the threshold, it may be considered that the chip A is normal.

If determining that the chip A is normal, the processor 100 may perform subsequent steps. If the chip is abnormal, the processor 100 does not perform subsequent steps, and may further prompt a user that a fault occurs in the chip A in the memory 300, so that the user can replace the chip A or replace the memory 300 in time.

Step 305: The processor 100 may perform data back-migration on the reset memory chip. In this embodiment of this disclosure, data back-migration means that data in the chip B is migrated to the chip A.

The processor 100 may send a data migration indication to the memory controller 400, to notify the memory controller 400 to migrate the data in the chip B to the chip A. After receiving the data migration indication, the memory controller 400 migrates the data in the chip B to the chip A. The memory controller 400 may further update the memory mapping table, and update the physical address in the memory mapping table that points to the chip B to the physical address that points to the chip A.

It should be noted that, in step 305, replacing the chip A in step 302 is a prerequisite. If only the chip A is isolated in step 302, the processor 100 does not need to perform step 305. The processor 100 may indicate the memory controller 400 to de-isolate the chip A. In other words, the memory controller 400 may update the memory mapping table, restore the mapping relationship related to the physical address of the chip A, and start to write data to the chip A.

Step 306: The processor 100 determines whether the fault of the chip A is recovered. A manner in which the processor 100 determines whether the fault of the chip A is recovered is similar to a manner in which the processor 100 determines whether the chip A is normal. For details, refer to the foregoing content.

If the processor 100 determines that the fault of the chip is recovered, the chip B may continue to be used as the redundant memory chip. If the fault is not recovered, the processor 100 may indicate the memory controller 400 to replace the chip A, and may further prompt the user that a fault occurs in the chip A in the memory 300, so that the user can replace the chip A or replace the memory 300 in time.

It should be noted that in this embodiment of this disclosure, both step 304 and step 306 are allowed to be performed, to ensure that the chip A can work normally after being reset and after the data back-migration. Alternatively, only either step 304 or step 306 is allowed to be performed. In this way, a quantity of operation of the processor 100 and the memory controller 400 can be reduced, thereby reducing power consumption.

According to step 305 and step 306, the chip B becomes the redundant chip again. When a faulty memory chip or a memory chip with degraded performance is found in the memory 300 again, the foregoing manner may still be used to replace the faulty memory chip or the memory chip with degraded performance with the chip B. Certainly, in some scenarios, the processor 100 may not perform the data back-migration, that is, not perform step 305 and step 306, and always replace the chip A with the chip B to store data. In this case, the chip A may be used as a new redundant memory chip. When a faulty memory chip or a memory chip with degraded performance is found in the memory 300 again, a similar manner may be used to replace the faulty memory chip or the memory chip with degraded performance with the chip A.

It can be learned from step 301 to step 306 that when a fault occurs in a memory chip in the memory 300, the processor 100 does not need to reset the entire memory 300. In other words, a service interruption of the computing device does not occur. In this embodiment of this disclosure, the processor 100 can locate a faulty memory chip, and reset only the faulty memory chip. In this way, system breakdown caused by a memory fault can be effectively avoided, and a probability of re-power-on, hardware replacement, or returning to a factory is reduced. In the manner according to this embodiment of this disclosure, a possibility of a service of the computing device being interrupted is also reduced.

A person skilled in the art should understand that embodiments of this disclosure may be provided as a method, a system, or a computer program product. Therefore, this disclosure may use a form of hardware-only embodiments, software-only embodiments, or embodiments with a combination of software and hardware. In addition, this disclosure may use a form of a computer program product that is implemented on one or more computer-usable storage media (including but not limited to a disk memory, a compact disc (CD) read-only memory (ROM) (CD-ROM), an optical memory, and the like) that include computer-usable program code.

This disclosure is described with reference to the flowcharts and/or block diagrams of the method, the device (system), and the computer program product according to this disclosure. It should be understood that computer program instructions may be used to implement each procedure and/or each block in the flowcharts and/or the block diagrams and a combination of procedures and/or blocks in the flowcharts and/or the block diagrams. These computer program instructions may be provided to a general-purpose computer, a special-purpose computer, an embedded processor, or a processor of another programmable data processing device to generate a machine, so that instructions executed by a computer or a processor of another programmable data processing device generate an apparatus configured to implement a function specified in one or more procedures in the flowcharts and/or in one or more blocks in the block diagrams.

These computer program instructions may alternatively be stored in a computer-readable memory that can instruct a computer or another programmable data processing device to work in a specific manner, so that the instructions stored in the computer-readable memory generate an artifact that includes an instruction apparatus. The instruction apparatus implements a specific function in one or more procedures in the flowcharts and/or in one or more blocks in the block diagrams.

These computer program instructions may alternatively be loaded onto a computer or another programmable data processing device, so that a series of operations and steps are performed on the computer or the other programmable device, to generate computer-implemented processing. Therefore, the instructions executed on the computer or the other programmable device provide steps for implementing a function specified in one or more procedures in the flowcharts and/or in one or more blocks in the block diagrams.

A person skilled in the art can make various modifications and variations to this disclosure without departing from the scope of this disclosure. In this case, this disclosure is intended to cover these modifications and variations of this disclosure provided that they fall within the scope of protection defined by the claims of this disclosure and their equivalent technologies.

What is claimed is:
1. A method comprising:
locating, by a processor, a first memory chip that is faulty in a memory system;
isolating or replacing the first memory chip; and
resetting, by the processor after isolating or replacing the first memory chip, the first memory chip when second memory chips in the memory system continue to work normally.
2. The method of claim 1, wherein the first memory chip comprises:

sending, by the processor and to a chip reset circuit, a reset instruction instructing to reset the first memory chip; and performing, by the chip reset circuit and based on the reset instruction, an operation on a reset pin of the first memory chip, to reset the first memory chip.

3. The method of claim 1, further comprising further isolating or replacing, by a memory controller, the first memory chip.

4. The method of claim 3, further comprising further replacing, by the memory controller, the first memory chip with a third memory chip in the second memory chips.

5. The method of claim 4, wherein resetting the first memory chip, the method further comprises instructing, by the processor, the memory controller to migrate data of the third memory chip back to the first memory chip and replace the third memory chip with the first memory chip.

6. The method of claim 3, wherein after isolating the first memory chip and resetting the first memory chip, the method further comprises instructing, by the processor, the memory controller to de-isolate the first memory chip.

7. The method of claim 1, wherein after resetting the first memory chip, the method further comprises:
locating, by the processor, a third memory chip that is faulty in the memory system; and
instructing, by the processor, a memory controller to replace the third memory chip with the first memory chip.

8. The method of claim 1, wherein after resetting the first memory chip, the method further comprises performing, by the processor and using a memory controller, data writing and reading on the first memory chip to determine that the first memory chip is working normally.

9. A system comprising:
a memory system comprising a first memory chip and second memory chips; and
a processor is coupled to the memory system and configured to:
locate the first memory chip that is faulty; and
reset, after the first memory chip is isolated or replaced, the first memory chip when the second memory chips continue to work normally.

10. The system of claim 9, wherein the first memory chip comprises a first reset pin, wherein the system further comprises a chip reset circuit, wherein the processor is further coupled to the first reset pin using the chip reset circuit, wherein the processor is further configured to send to the chip reset circuit, a reset instruction instructing to reset the first memory chip, and wherein the chip reset circuit is configured to perform, based on the reset instruction, an operation on the first reset pin to reset the first memory chip.

11. The system of claim 10, wherein the second memory chips comprise second reset pins, wherein the chip reset circuit is a serial-to-parallel conversion circuit, and wherein the chip reset circuit is connected to the first reset pin and the second reset pins.

12. The system of claim 9, further comprising a memory controller coupled to the memory system and configured to replace or isolate the first memory chip.

13. The system of claim 12, wherein the memory controller is further configured to further replace the first memory chip with a third memory chip in the second memory chips.

14. The system of claim 13, wherein after resetting the first memory chip, the processor is further configured to instruct the memory controller to migrate data of the third memory chip back to the first memory chip and replace the third memory chip with the first memory chip.

15. The system of claim 12, wherein after the memory controller isolates the first memory chip and the processor resets the first memory chip, the processor is further configured to instruct the memory controller to de-isolate the first memory chip.

16. The system of claim 9, further comprising a memory controller, wherein after the processor resets the first memory chip, the processor is further configured to:
locate a third memory chip that is faulty in the memory system; and
instruct the memory controller to replace the third memory chip with the first memory chip.

17. The system of claim 9, further comprising a memory controller coupled to the memory system, and wherein after resetting the first memory chip, the processor is further configured to perform, on the first memory chip and using the memory controller, data writing and reading to determine that the first memory chip is working normally.

18. A memory system comprising:
memory chips comprising a first memory chip and second memory chips; and
a chip reset circuit coupled to the and configured to:
receive a reset instruction instructing to reset the first memory chip, and
reset the first memory chip based on the reset instruction when the second memory chips are working normally.

19. The memory system of claim 18, wherein the chip reset circuit is further configured to further reset the first memory chip by performing an operation on a reset pin of the first memory chip.

20. The memory system of claim 18, wherein the chip reset circuit is a serial-to-parallel conversion circuit.

* * * * *

UNITED STATES PATENT AND TRADEMARK OFFICE
CERTIFICATE OF CORRECTION

PATENT NO. : 12,360,867 B2
APPLICATION NO. : 18/437707
DATED : July 15, 2025
INVENTOR(S) : Yangbin Diao et al.

Page 1 of 1

It is certified that error appears in the above-identified patent and that said Letters Patent is hereby corrected as shown below:

In the Claims

Claim 5, Column 15, Line 13: "The method of claim 4, wherein resetting the first" should read "The method of claim 4, wherein after resetting the first"

Claim 9, Column 15, Line 37: "a processor is coupled to the memory system and config-" should read "a processor coupled to the memory system and config-"

Claim 18, Column 16, Line 39: "a chip reset circuit coupled to the and configured to:" should read "a chip reset circuit coupled to the memory chips and configured to:"

Signed and Sealed this
Nineteenth Day of August, 2025

Coke Morgan Stewart
*Acting Director of the United States Patent and Trademark Office*